United States Patent
Ho

(10) Patent No.: US 7,352,619 B2
(45) Date of Patent: Apr. 1, 2008

(54) ELECTRONIC MEMORY WITH BINARY STORAGE ELEMENTS

(75) Inventor: Iu-Meng Tom Ho, Milpitas, CA (US)

(73) Assignee: Iota Technology, Inc., San Jose, CA (US)

(*) Notice: Subject to any disclaimer, the term of this patent is extended or adjusted under 35 U.S.C. 154(b) by 76 days.

(21) Appl. No.: 11/292,741

(22) Filed: Dec. 2, 2005

(65) Prior Publication Data

US 2006/0083098 A1 Apr. 20, 2006

Related U.S. Application Data

(63) Continuation-in-part of application No. 11/049,236, filed on Feb. 2, 2005, now abandoned.

(60) Provisional application No. 60/673,399, filed on Apr. 21, 2005, provisional application No. 60/542,094, filed on Feb. 5, 2004.

(51) Int. Cl.
*G11C 16/04* (2006.01)

(52) U.S. Cl. .......................... 365/185.03; 365/189.05; 365/230.06

(58) Field of Classification Search ........... 365/185.03, 365/189.05, 230.06
See application file for complete search history.

(56) References Cited

U.S. PATENT DOCUMENTS

| | | | |
|---|---|---|---|
| 4,287,670 A | 9/1981 | Stark | |
| 4,388,702 A | 6/1983 | Sheppard | |
| 4,586,163 A | 4/1986 | Koike | |
| 4,653,023 A | 3/1987 | Suzuki et al. | |
| 4,661,929 A | 4/1987 | Aoki et al. | |
| 4,771,404 A | 9/1988 | Mano et al. | |
| 4,893,272 A | 1/1990 | Eaton, Jr. et al. | |
| 4,964,079 A | 10/1990 | Devin | |
| 5,043,940 A | 8/1991 | Harari | |
| 5,218,569 A | 6/1993 | Banks | |
| 5,283,761 A | 2/1994 | Gillingham | |
| 5,351,210 A | 9/1994 | Saito | |
| 5,515,324 A | 5/1996 | Tanaka | |
| 5,790,456 A | 8/1998 | Haddad | |
| 6,233,173 B1 | 5/2001 | Chevallier et al. | |
| 6,310,815 B1 * | 10/2001 | Yamagata et al. | 365/230.03 |
| 6,483,373 B1 | 11/2002 | Lim et al. | |
| 2003/0202396 A1 | 10/2003 | Blodgett | |
| 2003/0206430 A1 | 11/2003 | Ho | |
| 2004/0080979 A1 | 4/2004 | Park | |

FOREIGN PATENT DOCUMENTS

| | | |
|---|---|---|
| EP | 0256935 A2 | 2/1988 |
| EP | 1298670 A1 | 4/2003 |

* cited by examiner

Primary Examiner—Huan Hoang
(74) Attorney, Agent, or Firm—Patton Boggs LLP

(57) ABSTRACT

An electronic memory using true and complementary dual bit lines and dual binary storage elements cell architecture comprising a memory cell pair with four binary storage elements with each memory cell pair capable of existing in up to sixteen electronic memory states. The four binary storage elements together, normally used to store two true and complementary data bits, are used to store two, three, or four data bits depending on the noise margin allowed and bit width selection. The memory can be ferroelectric memory FeRAM, a flash memory, a ROM, a dynamic memory DRAM, an OUM, a MRAM, a NAND memory, or a NOR memory.

20 Claims, 8 Drawing Sheets

ELECTRONIC MEMORY WITH BINARY STORAGE ELEMENTS

CROSS-REFERENCE TO RELATED APPLICATIONS

This patent application is a continuation-in-part under 37 CFR 1.53(b) of U.S. patent application Ser. No. 11/049,236 filed Feb. 2, 2005, now abandoned, which application claims the benefit of U.S. Provisional Application No. 60/542,094 filed Feb. 5, 2004. This application also claims the benefit of U.S. Provisional Application No. 60/673,399 filed Apr. 21, 2005. All of the above-referenced applications are incorporated by reference to the same extent as though fully disclosed herein.

FIELD OF THE INVENTION

The invention in general relates to electronic memories, and in particular, such memories capable of storing data in a plurality of binary storage elements.

BACKGROUND OF THE INVENTION

Electronic memories comprising arrays of memory cells arranged in rows and columns are well known. Most such memories are capable of storing a single bit of data in each memory cell. For speed, reliability, and robustness in a noisy and un-predictable environment, complementary dual bit lines cells are used to store the true and complementary data at the same time, where normally just one of the single cell is enough to store the data; e.g. 2T2C FeRAM cell, 3T2C Trinion FeRAM, 2T2C DRAM cell, 2T2C dynamic register cell, etc. Each of these 2C or 2R type dual bit lines cells has two binary storage elements and is normally equivalent to or can be used as two regular single cells. It seems a little wasteful since each storage element is only for storing one-half bit of the data, when a normal single cell would store one full bit of data.

Since the 2C or 2R type cells have two binary storage elements, they can each have four logic states, "00", "01", "10" and "11", and could represent two bits of data. Currently, only the "01" and "10" states are used to represent a robust Logic-0 and Logic-1 for a data bit. An improvement in the art would be obtained if these 2C or 2R type and dual bit lines robust cells could use the currently un-used states "00" and "11" to store more than just one bit of data, with some tolerable compromise on noise margin, and each storage element could store more than one-half bit of data. Having the choice to select bit width usage for a dual bit lines dual storage elements cell can be a yield improvement function for the specific memory.

BRIEF SUMMARY OF THE INVENTION

The invention provides a solution to the above problem by providing a memory architecture that utilizes the un-used extra "00", and "11" states for a 2C or 2R type dual bit lines dual binary storage elements cell, while each storage cell only has the choice of "0" or "1" states. A pair of these dual storage elements cells with dual bit lines can have a maximum combination of 16 logic states, where three bits of data can be extracted with a few more spare states for special applications, i.e., Lost data, Un-programmed, etc. Since 16 logic states can represent two bits, three bits, or four bits of data, a bit width mode select can be used to switch between bit widths depending on noise margin allowed. In the case of two bits, each storage element stores the equivalent of one-half bit of data, and it can provide the highest noise margin for reading sense amplifier. In the case of three bits, each storage element stores the equivalent of three-quarters bit of data, and the noise margin is less for reading sense amplifier. In the case of four bits, each storage element stores one full bit of data. The noise margin is the lowest, and it also requires a reference voltage.

The memory architecture according to the invention utilizes multiple memory cells to obtain two, three, four, or more bits of data. For example, in the preferred embodiment, two dual bit lines with 2C or 2R dual storage elements cells are used to obtain three bits of data. It is preferred that each of the storage elements stores only a binary data value "0" or "1", and the storage element can be of capacitive type such as DRAM, or FeRAM, or resistive type such as OUM, MRAM, EPROM, Floating Gate, Flash, etc. There are four logic states available with each dual bit lines dual storage elements cell, i.e., "00", "01", "10", and "11". Two of these dual bit lines dual storage elements cells can have a combination of sixteen logic states, which can represent two, three, or four bits of data, with multiple spare states for designers to make design compromise when two or three bits are chosen. The two dual bit lines dual storage elements cells can be combined in one cell forming a quad bit lines with quad storage elements cell, e.g. 4T4C, 5T4C, 6T4C, 8T4C, 4T4R, 5T4R, 6T4R, 8T4R, etc., or can be placed in two or four different locations as required by layout and circuit design considerations, e.g. 4×1T1C(R), 4×2T1C(R), etc., for four different locations, or 2×2T2C(R), 2×3T2C(R), 2×4T2C(R), etc., for two different locations. The idea is that the four individual storage elements can be placed together in one cell with quad bit lines, split to two locations in two cells with dual bit lines, or split to four locations with single bit lines. Each of the storage element stores one-half bit data when the cell is used in two-bits mode, three-quarters bit data when the cell is used in three-bits mode, or one full data bit when the cell is used in four-bits mode. There is no preference that all four storage elements be in one cell, two cells, or four cells.

The invention provides an electronic memory comprising: memory cell or cells with a total of four storage elements, capable of existing in sixteen electronic memory states; a write circuit for writing two, three, or four data bits to said memory cell; and a read circuit for reading two, three, or four data bits from said memory cell, wherein at least one data bit is determined by an electronic memory state of said one of the four storage elements. Preferably, said memory cell includes one of the extra states that is not used in representing said two or three data bits. Preferably, said memory cell is capable of existing in a total of sixteen possible memory state combinations and there are three of said data bits with eight extra states. Preferably, one of said eight extra state combinations is not used in directly recording said three data bits. Preferably, said memory further includes differential sense amplifiers and decoding logic to optimally extract two, three, or four bits, with one extra signal to determine the status from the un-used extra states when it is used in a three-bits configuration. The four-storage elements memory cell can be a flash memory, a read only memory (ROM), a ferroelectric memory (FeRAM or FRAM), a dynamic memory such as dynamic random access memory (DRAM) or a dynamic register, an ovonic unified memory (OUM), or a magnetoresistive random access memory (MRAM). In the case of a dynamic memory, the memory cells preferably include a MOS capacitor, and more preferably, a NMOS capacitor. The memory can be ferroelectric memory, which maybe a non-volatile memory, a destructive read out memory, or a non-destructive readout memory. The memory may also be either a NAND memory, a NOR memory, or a virtual ground type memory.

In one aspect, the invention provides an electronic memory comprising: four bit lines and four binary storage elements, each of the binary storage elements connected or connectable to one of the bit lines; a write circuit for writing one, two, or three bits of data to the four binary storage elements; a read circuit for reading one, two, or three data bits from the four binary storage elements; and a bit width select circuit for selecting the number of bits the read circuit reads to the four binary storage elements and the write circuit writes to the four binary storage elements. Preferably, the bit width select circuit includes circuit elements for selecting whether two, three, or four bits of data are read from or written to the four binary storage elements.

In a further aspect, the invention provides an electronic memory comprising: four bit lines and four binary storage elements, each of the binary storage elements connected or connectable to one of the bit lines; a write circuit for writing bits of data to the four binary storage elements wherein at least one of the data bits is used to determine the binary electronic memory states of all four binary storage elements; and a read circuit for reading data bits from the storage elements, wherein at least one data bit is determined by the binary electronic memory states of all four binary storage elements. Preferably, the write circuit further writes an option flag bit to the four binary storage elements, and the read circuit further reads an option flag bit from the binary storage elements. Preferably, the read and write circuits include a bit width select circuit for selecting whether two or three bits of data are read from and written to the four binary storage elements. Preferably, the bit width select circuit includes circuit elements for selecting whether two, three, or four bits of data are read from and written to the four binary storage elements. Preferably, the read and write circuits include a bit width select circuit for selecting whether three or four bits of data are read from and written to the four binary storage elements. Preferably, the memory has a data bus width not divisible by three where a combination of bit width two and three are used. The memory may be a flash memory, a read only memory (ROM), a dynamic memory, a dynamic random access memory (DRAM), a dynamic register, an ovonic unified memory (OUM), a magnetoresistive random access memory M a ferroelectric memory, a destructive read out memory, a non-destructive readout memory, a NAND memory, a NOR memory, or a virtual ground memory. The memory storage element may be a capacitor, a transistor, or a resistor.

Numerous other features, objects, and advantages of the invention will become apparent from the following description when read in conjunction with the accompanying drawings.

DETAILED DESCRIPTION OF THE INVENTION

The invention relates to electronic memories. These memories include memory arrays comprising rows and columns of memory cells electrically connected with signal lines, such as word lines and bit lines, plus associated circuitry for writing and reading to the memory.

Figure 1:
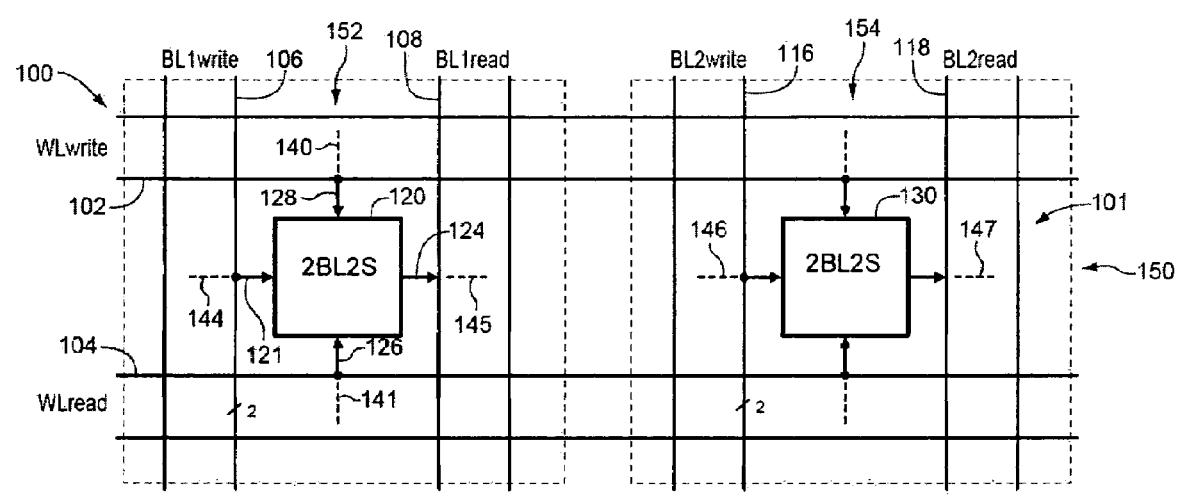
FIG. 1 is a generalized circuit diagram illustrating the paired dual bit lines dual storage elements architecture according to the invention.

FIG. 1 shows a generalized circuit diagram illustrating the paired dual bit lines dual storage elements architecture according to the invention. Memory array portion 100 includes a cell pair 101 comprising a first dual bit lines dual storage elements cell 120 and a second dual bit lines dual storage elements cell 130. The cell has two storage elements, and the dual bit lines, e.g. 106, represent two bit lines which are normally used as true and complementary data. Each of the dual bit lines dual storage elements cell can have four logic states, "00", "01", "10", and "11". The state refers to the charge and resistance states as in each of the capacitive or resistive storage element. There are sixteen different states available to the cell pair 101.

Cells 120 and 130 are addressed by word write line 102 carrying a write signal WLwrite and word read line 104 carrying a word read signal WLread. Cell 120 is also addressed by write bit line 106 carrying signal BL1write and read bit line 108 carrying signal BL1read, while cell 130 is also addressed by write bit line 116 carrying signal BL2 and read bit line 118 carrying signal BL2. Each cell, such as 120, has a write port 121 connected to the write bit line 106 and a read port 124 connected to the read bit line and is connected to the write word line 102 and read word line 104 via address lines 128 and 126, respectively. Generally, there are additional rows of cells above and below row 150 as indicated by dotted lines 140 and 142 and additional columns of cells to the left and right of columns 152 and 154 as indicted by dotted lines 141 and 147, respectively. There also may be additional columns of cells between columns 152 and 154 as indicated by dotted lines 145 and 146; that is, cell pair 101 is not necessarily comprised of neighboring cells.

The term "a storage element" means a single capacitor, a single transistor, a single resistor, a single magnetoresistive element, or a single other element that is conventionally used as a storage element in an electronic memory. It is noted that some memory cells, such as dual floating gate NAND flash cells, actually contain two storage elements, since the floating gate has an insulating portion which divides the gate in two. This is not considered to be a single storage element, since there are two separate storage gates in the dual gate structure. In general, the most common storage element can be of two types: resistive, which depends on variation of drive strengths or threshold voltage variation to provide the binary logic "0" and "1" states; or capacitive, which depends on the amount of charge stored for the logic "0" and "1" states. In general, each port, read or write, can have its own corresponding control lines and bit line, or control lines can be shared or merged depending on timing and applications; bit lines can also be shared, merged, or joined serially depending on timing and applications, or read and write ports can also be shared or merged together depending on the applications. Some examples include: a DRAM cell is a capacitive type single port READ/WRITE with merged word line and bit line; a dynamic 1R1W register cell is a capacitive type one read port and one write port; a dynamic 1R2W register cell is a capacitive type one read port and two write ports; a dynamic 2R2W register cell is a capacitive type two read ports and two write ports; an OUM cell is a resistive type single port READ/WRITE with merged word line and bit line; a MRAM cell is a resistive type single port READ/WRITE with merged word line and bit line; a 1T1C FeRAM cell is a capacitive type single port READ/WRITE with one bit line and two word lines with one of the word lines used as a plate line.

Figure 2:
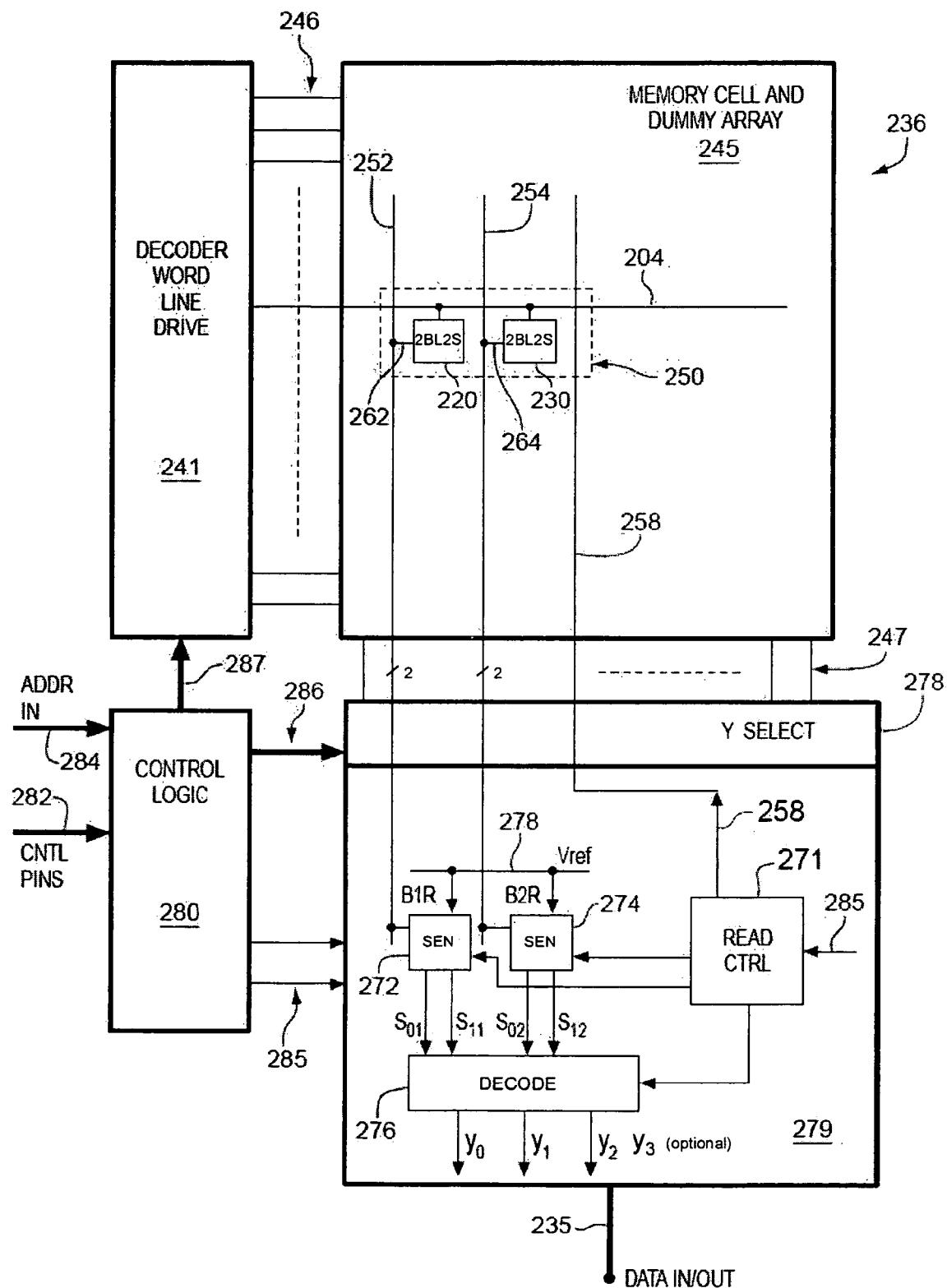
FIG. 2 is a block circuit diagram illustrating the architecture of a paired dual bit lines dual storage elements architecture during the read operation according to the invention.

FIG. 2 shows an exemplary memory 200 using dual bit lines dual storage elements cells according to the invention illustrating the read circuitry 436, illustrating how a dual bit lines dual storage elements Pair 250 is used to obtain two, three, or four bits of digital data, Y0, Y1, Y2, and Y3. Each of the dual bit lines dual storage elements cells 220 and 230 has its own corresponding differential sense amplifier 272 and 274, respectively, connected to its read port, 262 and 264, respectively, via its corresponding bit lines 252 and 254, respectively.

Memory 200 includes decoder and word line drive 441, memory cell array 245, column (y) selector circuit 278, input/output circuitry 279, and control logic 280. Memory cell array 245 includes dual bit lines dual storage elements cell pair 250, read word line 204, read bit lines 252, optionally decoded read drive line 258, as well as other cell pairs and word and drive lines as discussed above in connection with FIG. 1. The cell pairs and drive lines are not shown in order to make the connections between the exemplary cells and lines clearer. Array 245 also includes architectures that include dummy cells. Cell pair 250 includes first memory cell 220 and second memory cell 230, which are connected to read word line 204. Cell 220 is also connected to read bit line 252, while cell 230 is connected to read bit line 253.

Read Control logic 280 receives control signals from control pins 282 and address signals on address lines 284 and provides row address signals to decoder 241 on row address bus 287, column address signals to column selector circuit 278 on column address bus 286, and input/output control signals to input/output circuit 279 on lines 285. Row decoder 441 decodes the row address and applies word line signals on word lines 246, including the read word line 204 associated with cells 220 and 230. Input/output circuitry 279 includes differential sense amplifiers 272 and 274, read control circuitry 271, and decoder 276. The inputs to differential sense amplifiers 272 and 274 include a read control signal, a voltage reference signal $V_{ref}$ from reference voltage source 278, and the bit line signal B1 and B2, respectively, from the corresponding read bit lines 252 and 254. The $V_{ref}$ is not needed for two bits or three bits data. Each differential sense amplifier outputs two signals, S01 and S02, from differential sense amplifier 272, and S02 and S12 from differential sense amplifier 274, which signals are input into decoder 276. An example of how the two output signals S0 and S1 mapped for the decoder is shown in Table 1:

TABLE 1

| S0 | S1 | two-bits | three-bits | four-bits | |
|----|----|----|----|----|----|
| 0 | 0 | un-definite | not-binary | 0 | 0 |
| 0 | 1 | logic one | logic one | 0 | 1 |
| 1 | 0 | logic zero | logic zero | 1 | 0 |
| 1 | 1 | un-definite | not-binary | 1 | 1 |

In Table 1, the representation of the values of S0 and S1 for two bits, three bits, and four bits mode, and the zeros "0" and ones "1" represent corresponding logic states. Depending on the bit width mode, differential sense amplifiers can be optimized to generate the corresponding S0 and S1 signals. The common mode rejection capability of differential sense amplifiers can be used to distinguish the "not-binary" state from "logic one" and "logic zero" states.

The read control circuit 271 also inputs a signal to differential sense amplifier 275. The output from read decoder 276 is Y0, Y1, Y2, and Y3 outputs with Y2 and Y3 optional depending on the bit width mode on data out bus 235. Decoding for bit width modes two bits and four bits are conventional and straightforward Two different samples of decoding maps from the S01, S11, S02, and S12 signals in the three bits mode to the Y0, Y1, and Y2 signals are shown in Table 2 and Table 3.

TABLE 2

| S01 | S11 | S02 | S12 | Y0 | Y1 | Y2 |
|----|----|----|----|----|----|----|
| 0 | X | 0 | X | 0 | 0 | 0 |
| 0 | X | 1 | 0 | 0 | 0 | 1 |
| 0 | X | 1 | 1 | 0 | 1 | 0 |
| 1 | 0 | 0 | X | 0 | 1 | 1 |
| 1 | 0 | 1 | 0 | 1 | 0 | 0 |
| 1 | 0 | 1 | 1 | 1 | 0 | 1 |
| 1 | 1 | 0 | X | 1 | 1 | 0 |
| 1 | 1 | 1 | X | 1 | 1 | 1 |
| 1 | 1 | 1 | 1 | (Extra State) | | |

TABLE 3

| S01 | S11 | S02 | S12 | Y0 | Y1 | Y2 |
|----|----|----|----|----|----|----|
| 0 | 0 | 0 | 0 | (Error flag) | | |
| 0 | 0 | 1 | 0 | 0 | 0 | 0 |

TABLE 3-continued

| S01 | S11 | S02 | S12 | Y0 | Y1 | Y2 |
|-----|-----|-----|-----|-----|-----|-----|
| 1 | 0 | 0 | 0 | 1 | 0 | 0 |
| 1 | 0 | 1 | 0 | 0 | 1 | 0 |
| 1 | 0 | 0 | 1 | 1 | 1 | 0 |
| 0 | 1 | 1 | 0 | 0 | 0 | 1 |
| 0 | 1 | 0 | 1 | 1 | 0 | 1 |
| 0 | 1 | 0 | 0 | 0 | 1 | 1 |
| 0 | 0 | 0 | 1 | 1 | 1 | 1 |
| 0 | 0 | 1 | 1 | don't care | | |
| 0 | 1 | 1 | 1 | don't care | | |
| 1 | 0 | 1 | 1 | don't care | | |
| 1 | 1 | 1 | 1 | don't care | | |
| 1 | 1 | 0 | 0 | don't care | | |
| 1 | 1 | 0 | 1 | don't care | | |
| 1 | 1 | 1 | 0 | don't care | | |

The decoding maps are selected depending on circuit design considerations. The Extra states can be ignored or optimally used to simplify the design of the differential sense amplifiers and the decoding circuits. The Error Flag can be used as Un-programmed, Lost charge, Fast Cell, etc. If data output 235 is a bus and Y0, Y1, Y2, and Y3 are output in parallel, they represent four separate data outputs. If data output 235 is a single pin and Y0, Y1, Y2, and Y3 are sent in series through one pin, they can be considered as four different values for one data output. Depending on the bit width mode of the read/write circuitry, Y2 and Y3 can be optional, as stated before.

Figure 3:
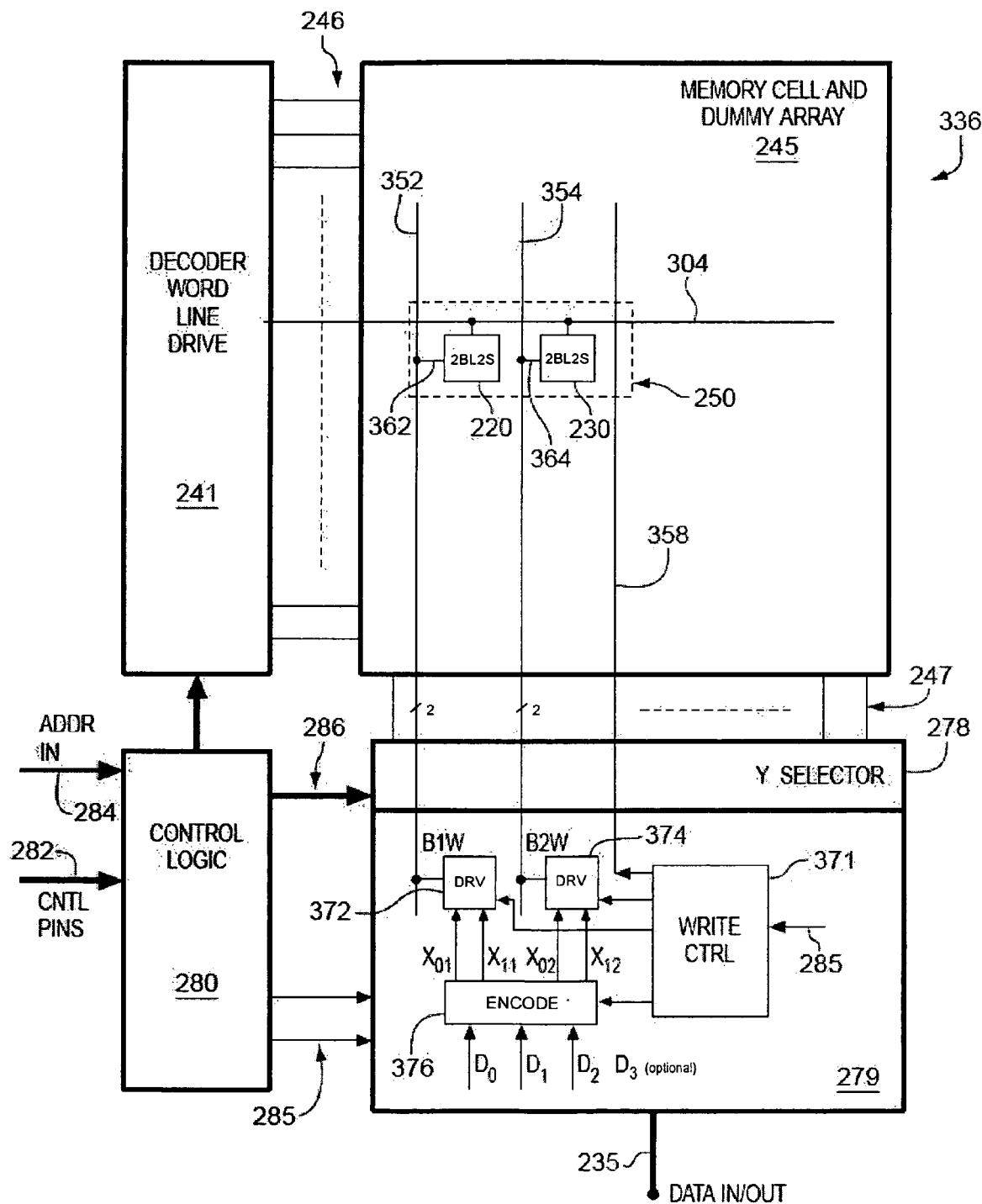
FIG. 3 is a block circuit diagram illustrating the paired dual bit lines dual storage elements architecture during the write operation according to the invention.

FIG. 3 shows an exemplary memory 200 using dual bit lines dual storage elements cells according to the invention illustrating the write circuitry 336 for writing data to the dual bit lines dual storage elements pair 250. This memory 200 is the same as the memory of FIG. 3, except the write portions are shown. Identical elements are identified with the same numerals as used in FIG. 2. In addition to these elements, memory 200 includes write bit lines 352 and 354 and write ports 362 and 364 associated with dual bit lines dual storage elements cells 220 and 230, respectively, write word line 304, drivers 372 and 374, encoder, write control circuit 371 which receives inputs from lines 285, and optional Y-decoded write drive line 358. FIG. 3 illustrates the circuitry for encoding four data bits D0, D1, D2, and D3 and are encoded and written into cells 220 and 230. D2 and D3 can be optional depending on the bit width mode. For two bits, only D0 and D1 are used. For three bits, D0, D1, and D2 are used. For four bits, D0, D1, D2, and D3 are all used.

Figure 4:
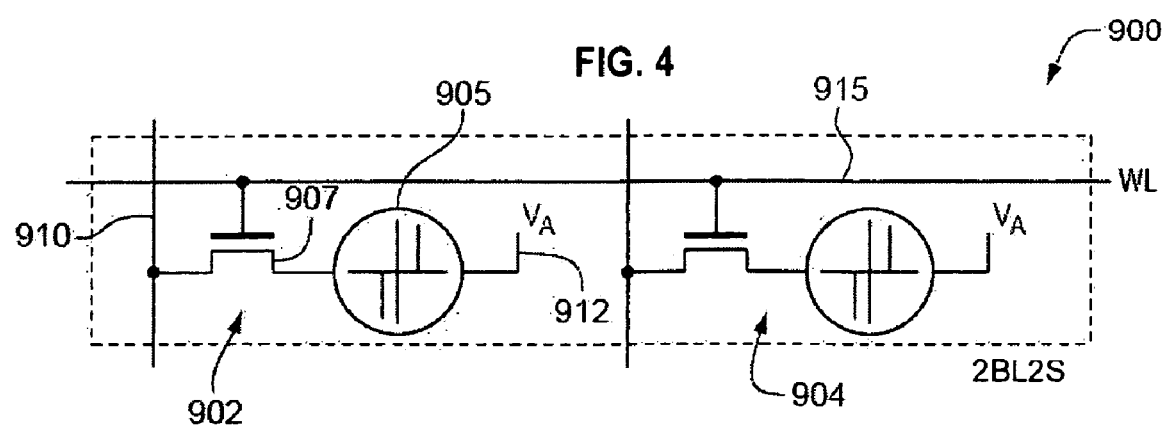
FIG. 4 is a circuit diagram illustrating a dual bit lines dual storage elements Ovonic Unified Memory (OUM) according to the invention.

FIG. 4 shows a dual bit lines dual storage elements memory cell 900 for an Ovonic Unified Memory (OUM). Cell 900 includes a first OUM cell 902 and a second OUM cell 903. Each cell, such as 902, includes a transistor 907, preferably a MOS transistor, and an OUM element 905. One source/drain of transistor 907 is connected to the corresponding bit line 910, and the other source/drain is connected to the OUM element 905. The gate of transistor 907 is connected to its corresponding word line 915. The other side of OUM element 905 is connected to a source 912 of a reference voltage $V_A$. In the OUM, the digital data of 1s and 0s are stored as amorphous (high resistance and non-reflective) or crystalline (low resistance and reflective) structures. By using electrical energy controlled by transistors, such as 907, the desired digital data can be written into the OUM cells. In conventional applications, only 0s or 1s, representing only two states, are written into the OUM cells. The read operation is performed by sensing either the low or the high resistive states of the OUM cells.

Figure 5:
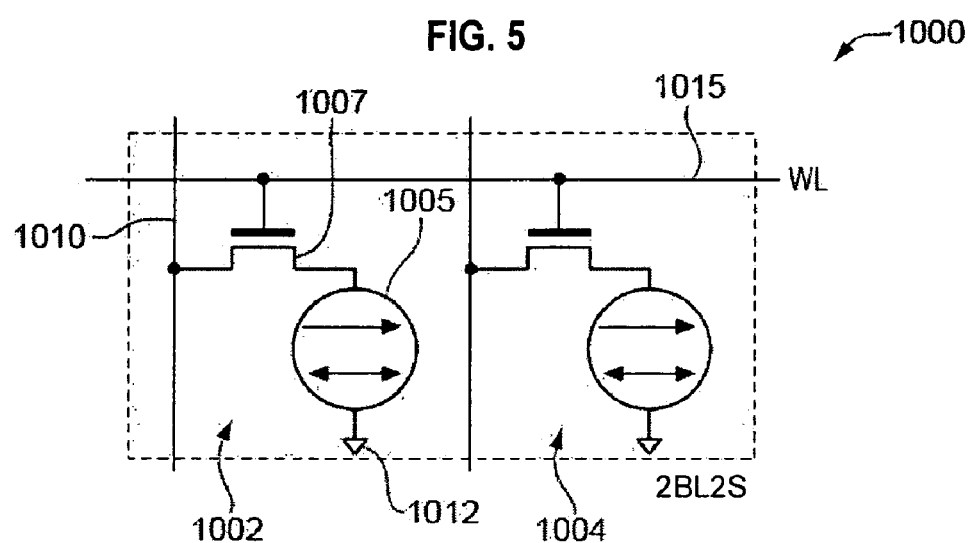
FIG. 5 is a circuit diagram illustrating a dual bit lines dual storage elements Magnetoresistive RAM (MRAM) according to the invention.

FIG. 5 shows a dual bit lines dual storage elements memory cell 1000 for a Magnetoresistive RAM (MRAM). Cell 1000 includes a first MRAM cell 1002 and a second MRAM cell 1003. Each cell, such as 1002, includes a transistor 1007, preferably a MOS transistor, and a MRAM element 1005. One source/drain of transistor 1007 is connected to the corresponding bit line 1010, and the other source/drain is connected to the MRAM element 1005. The gate of the transistor 1007 is connected to its corresponding word line 1015. The other side of MRAM element 1005 is connected to a ground voltage 1012. In the MRAM the digital data of 1s and 0s are stored as magnetic states that have different resistances. By using electrical energy controlled by transistors, such as 1007, the desired digital data can be written into the MRAM cells. In conventional applications, only 0s or 1s, representing only two states, are written into the MRAM cells. The read operation is performed by sensing either the low or the high resistive states of the MRAM cells.

Figure 6:
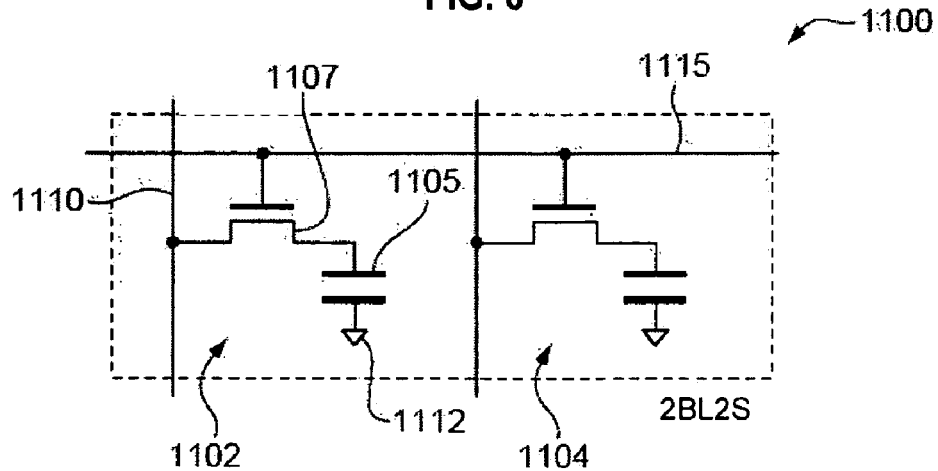
FIG. 6 is a circuit diagram illustrating a dual bit lines dual storage elements DRAM cell according to the invention.

In dynamic storage components like DRAM, 1TSRAM, PSRAM, Dynamic Register array, Dynamic FIFO, etc., a capacitor is being used in the memory cell to store the desired logic state. FIG. 6 shows a dual bit lines dual storage elements memory cell 1100 for a Dynamic RAM (DRAM). This cell can be used in many dynamic storage applications, such as 1TSRAM, PSRAM, etc. Cell 1100 includes a first DRAM cell 1102 and a second DRAM cell 1103. Each cell, such as 1102, includes a transistor 1107, preferably a MOS transistor, and a capacitor 1105. One source/drain of transistor 1107 is connected to the corresponding bit line 1110, and the other source/drain is connected to the capacitor 1105. The gate of the transistor 1107 is connected to its corresponding word line 1115. The other side of capacitor 1105 is connected to a ground voltage 1112. The storage capacitor is charged or discharged by a voltage placed across it to represent the digital data of 1s and 0s.

Figure 7:
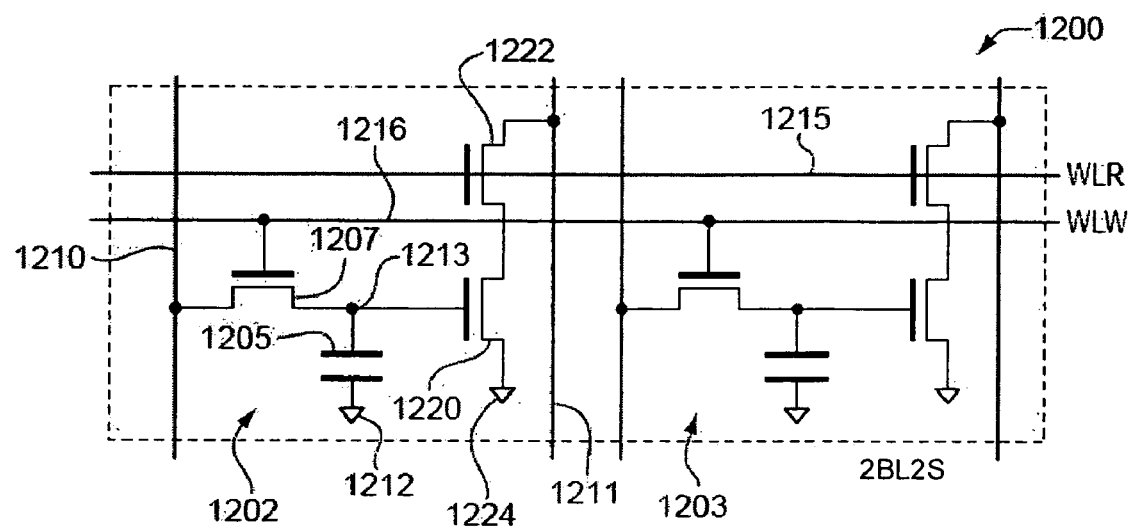
FIG. 7 is a circuit diagram illustrating a dual bit lines dual storage elements dynamic register cell according to the invention.

FIG. 7 shows another example of a dynamic dual bit lines dual storage elements storage cell, i.e., a dynamic register cell 1200, which includes a first dynamic register 1202 and a second dynamic register 1203. Each dynamic register, such as 1202, includes a gate transistor 1207, a storage capacitor 1205, a read transistor 1220, and a read select transistor 1222. Transistors 1207, 1220, and 1222 are preferably MOS transistors and most preferably CMOS transistors. One source/drain of transistor 1207 is connected to write bit line 1210, and the other source/drain is connected to the side of capacitor 1205 connected to node 1213. The gate of transistor 1207 is connected to the write word line 1216 carrying the signal WLW. The other side of capacitor 1205 is connected to ground 1212. Node 1213 is also connected to the gate of transistor 1220. One source/drain of transistor 1220 is connected to ground, and the other is connected to one source/drain of transistor 1222. The other source/drain of transistor 1222 is connected to the read bit line 1211. The gate of read select transistor 1222 is connected to read word line 1215 carrying signal WLR. As known in the art, dynamic register 1202 operates as follows. When write word line 1216 is high, transistor 1207 is on and the voltage on write bit line 1210 determines a charge placed on capacitor 1205. The charge on capacitor 1205 determines the voltage on the gate of transistor 1220, which determines the current or resistance of transistor 1220. When read word line 1215 is high, a voltage or current can be read on bit line 1211 to read the state of capacitor 1205.

Figure 11:
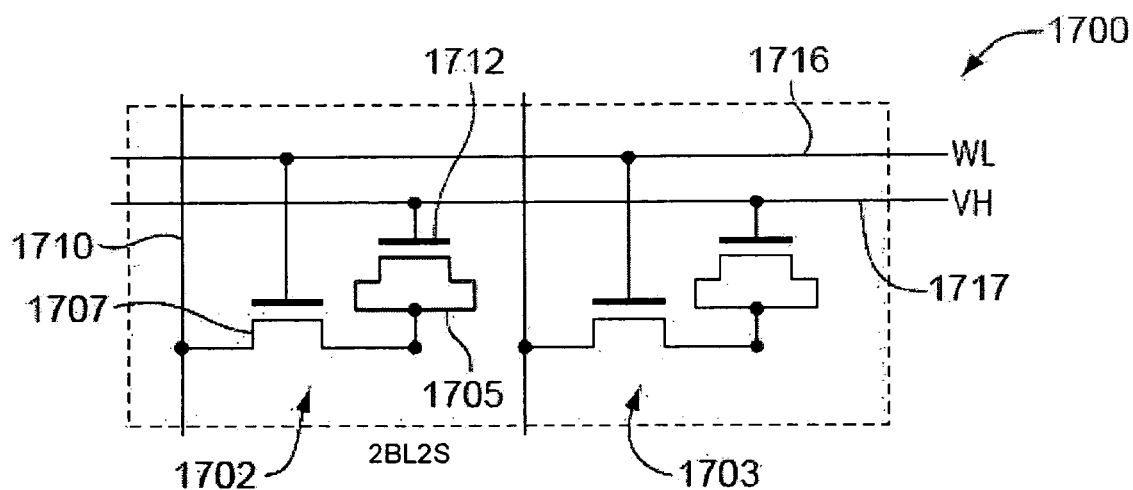
FIG. 11 is a circuit diagram illustrating a dual bit lines dual storage elements DRAM cell with MOS capacitors according to the invention.

The capacitors used in any dual bit lines dual storage elements cell with dynamic charge storage can be any capacitor available in the specific process, e.g., MIM, PIP, PN junction, trench capacitor, stacked capacitor, sidewall capacitor, NMOS capacitor, PMOS capacitor, native NMOS capacitor, native PMOS capacitor, depletion NMOS capacitor, ferroelectric capacitor, etc. To maximize the capacitance on a MOS capacitor, the MOS transistor can be depletion implanted with Negative VT, or a native NMOS with VT close to 0V, or NMOS transistor with the gate node connected to a high voltage so the NMOS transistor will be in an ON state to maximize the effective capacitance. FIG. 11 shows an example of a dual bit lines dual storage elements DRAM cell 1700 with NMOS capacitors, such as 1705. Cell 1700 includes a first cell 1702 and a second cell 1703. Each cell includes a MOS access transistor 1707 and a MOS capacitor 1705. The access transistor 1707 has one source/drain connected to bit line 1710 and the other connected to one side of capacitor 1705 and its gate connected to word line 1716. As known in the dynamic RAM art, the NMOS capacitor 1705 includes a gate 1712 that is connected to a line 1717 carrying a high voltage VH. The NMOS capacitors are turned ON by VH. The NMOS capacitors can be depletion NMOS, native NMOS, or NMOS transistors.

Figure 8:
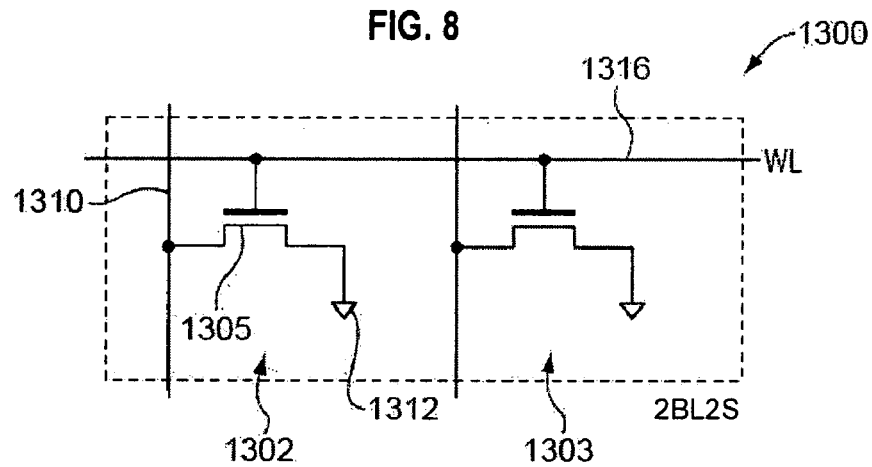
FIG. 8 is a circuit diagram illustrating a dual bit lines dual storage elements NOR ROM cell according to the invention.

FIG. 8 shows a dual bit lines dual storage elements NOR ROM cell 1300, including a first ROM cell 1302 and a second ROM cell 1303. As is known in the art, one source/drain of capacitor 1305 is connected to bit line 1310, and the other is connected to ground 1312. The gate of transistor 1305 is connected to the corresponding word line 1316. The transistors can be a floating gate to form a dual bit lines dual storage elements NOR flash cell.

Figure 9:
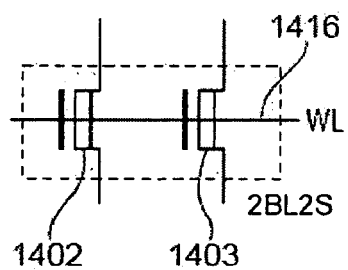
FIG. 9 is a circuit diagram illustrating a dual bit lines dual storage elements NAND ROM cell according to the invention.

FIG. 9 illustrates a dual bit lines dual storage elements NAND ROM cell, which includes first transistor 1402 and second transistor 1403 with their gates connected to word line 1416. As known in the art, each column of transistors is connected in series, with a pull-up device at one end of the series and a ground at the other. All word lines are high except for the row selected. The transistors can be a floating gate to form a dual bit lines dual storage elements NAND flash cell.

Figure 10A:
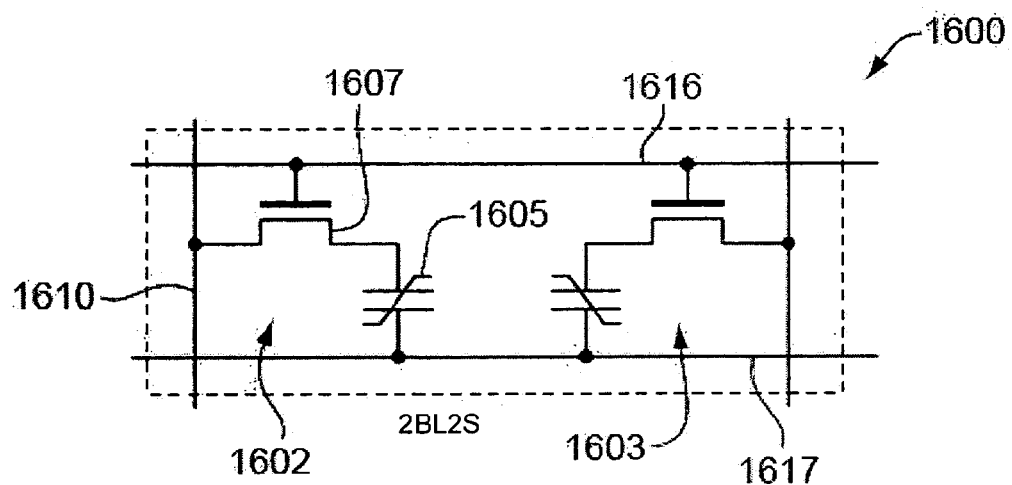
FIG. 10a is a circuit diagram illustrating a dual bit lines dual storage elements 2T2C FERAM cell according to the invention.

FIG. 10a shows an exemplary 2T2C ferroelectric memory cell 1600 with dual bit lines dual storage elements, which includes a first ferroelectric cell 1602 and a second ferroelectric cell 1603. Each cell, such as 1602, includes a transistor 1607, which preferably is a MOS transistor, and most preferably a CMOS transistor, and a capacitor 1605. One source/drain of transistor 1607 is connected to bit line 1610, and the other is connected to one side of capacitor 1605. The other side of capacitor 1605 is connected to plate line 1617. When a word line 1616 is high and a voltage sufficiently higher than the voltage on plate line 1617 is placed on bit line 1610, the ferroelectric capacitor 1605 switches to one state, say state A. When a voltage sufficiently lower than the voltage on plate line 1617 is placed on bit line 1619 when word line 1616 is high, capacitor 1605 switches to state B. Here, "sufficiently higher" or "sufficiently lower" means a voltage difference equal to or greater than the ferroelectric coercive voltage, which in most ferroelectric memories is 2.5 volts to 5 volts.

Figure 10B:
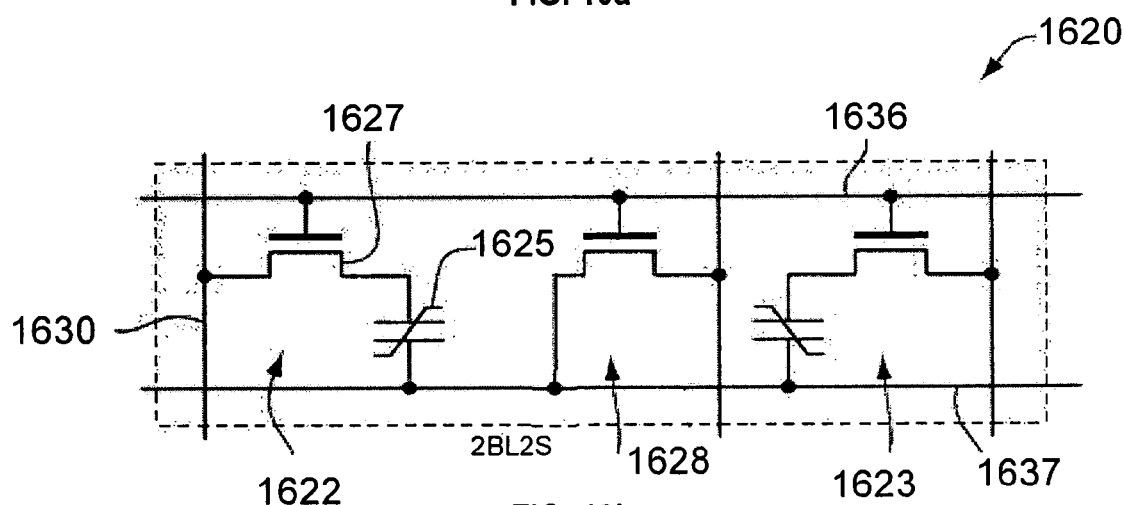
FIG. 10b is a circuit diagram illustrating a dual bit lines dual storage elements 3T2C Trinion FERAM cell according to the invention.

There are probably hundreds of different architectures of ferroelectric memories, all of which can be used as dual bit lines dual storage elements as in this invention to generate two bits and four bits as usual, and three-bits with extra states to use. Some of these are the 1T/1C cell described in U.S. Pat. No. 4,893,272, the trinion cell described in United States Patent Publication No. 20030206430 as in FIG. 10b, and the chain cell described in U.S. Pat. No. 6,483,373, all of which are hereby incorporated by reference to the same extent as though fully disclosed herein.

Since the preferred dual bit lines dual storage elements cell strategy can be used with nearly every memory cell architecture, this strategy is suitable for both volatile and non-volatile memories. It is also applicable to mirror-bit two transistor styles of memory cell. The two dual bit lines dual storage elements cells can be located together in one unit cell forming quad bit lines with a quad storage elements cell, e.g. 4T4C, 5T4C, 6T4C, 8T4C, 4T4R, 5T4R, 6T4R, 8T4R etc., or can be placed in two or four different locations as required by layout and circuit design considerations, e.g. 4×1T1C(R), 4×2T1C(R), etc., for four different locations, or 2×2T2C(R), 2×3T2C(R), 2×4T2C(R), etc., for two different locations. The idea is that the four individual storage elements can be placed together in one cell with quad bit lines, split to two locations in two cells with dual bit lines, or split to four locations with single bit lines. The specific implementation is dependent on each individual memory cell technology. That is, the invention is not limited to the exact implementations of each individual technology described herein, but is broad enough to include using the preferred pair of dual bit lines dual storage elements cells to get two bits, three bits, or four bits out of the cell pair depending on the choice of circuit designers or the bit width mode selected.

In all of the above figures described, where NMOS passgates are shown in the schematics as examples, they could be PMOS, N/P MOS, bipolar transistors, finFet, triple-gate Transistors, etc., depending on circuit design requirements.

Figure 12:
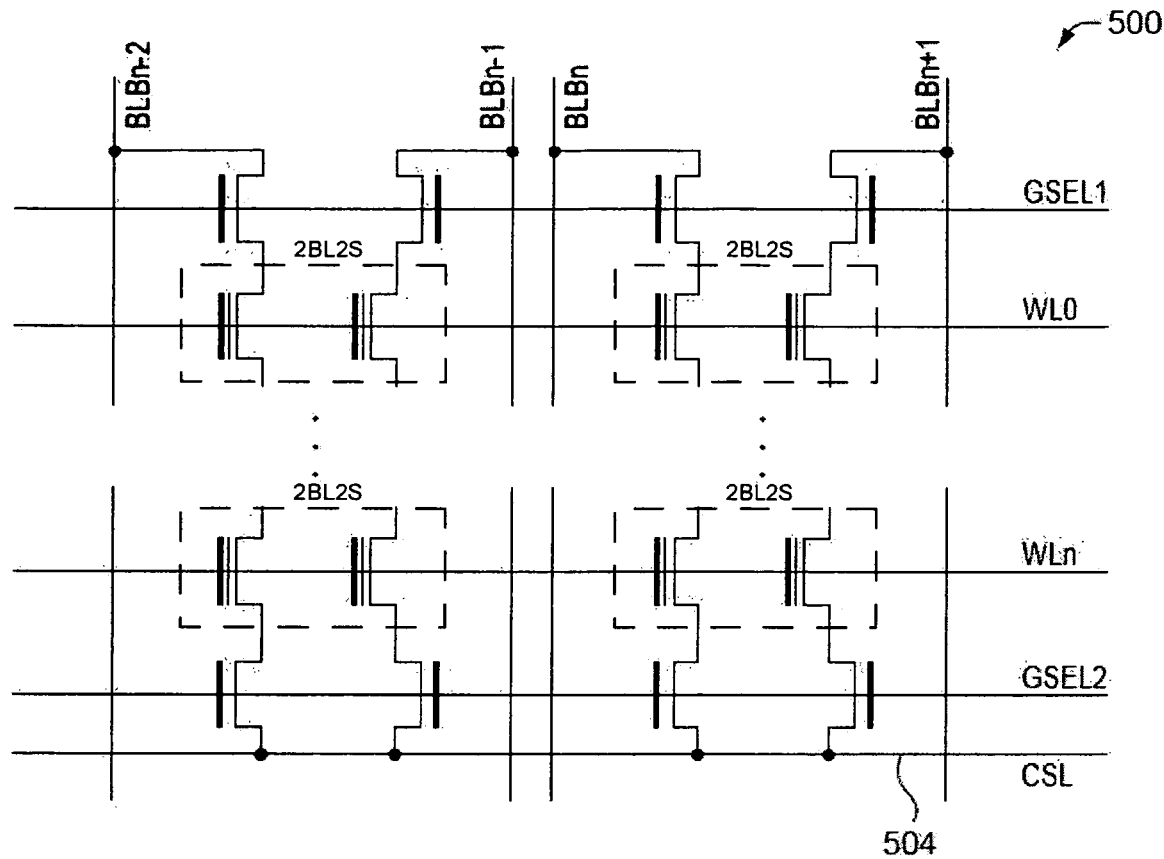
FIG. 12 is a circuit diagram illustrating a portion of the 2BL2S dual bit lines dual storage elements architecture of a NAND flash memory according to the invention.

FIG. 12 illustrates an application of the dual bit lines dual storage elements in a portion of a true and complementary NAND flash memory core 500. Two of the 2BL2S cells contain four floating gate storage elements. This "CSL" line 504 can also be shared with a mirrored block of cells as known in the art. Any of the memory cores described above or below can also be varied for layout efficiency as known in the art. For example, two flash cells can be folded so that there are four transistors in one cell instead of two. The same is applicable to the dual floating gate NAND flash and the split-gate floating gate NAND flash memories.

Figure 13:
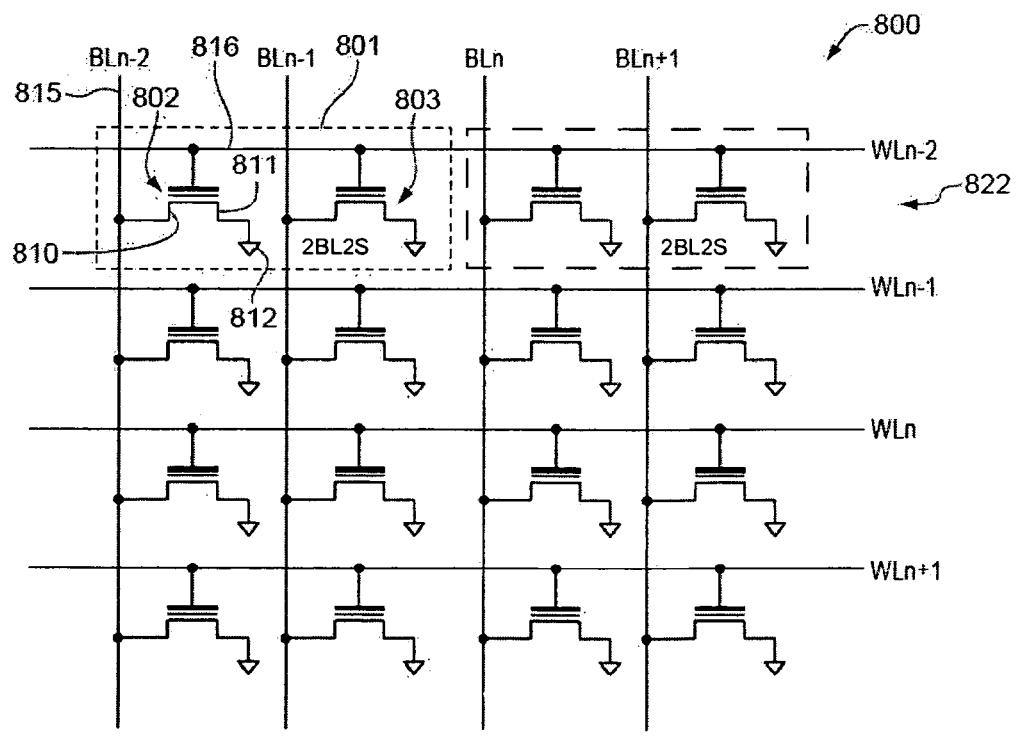
FIG. 13 is a circuit diagram illustrating a 2BL2S dual bit lines dual storage elements architecture virtual ground NOR flash memory core architecture according to the invention.

FIG. 13 shows an array architecture for a true and complementary NOR flash memory. In array 800, each 2BL2S cell 801 includes a first floating gate transistor 802 and a second floating gate transistor 803. One source/drain 810 of each transistor, such as 802, is connected to its corresponding bit line 815, and the other source/drain 811 is connected to ground 812. The gates of the transistors in a row 822 are connected to the word line 816 associated with the row. Two of the adjacent 2BL2S cells contain four binary storage floating gate transistors.

Figure 14:
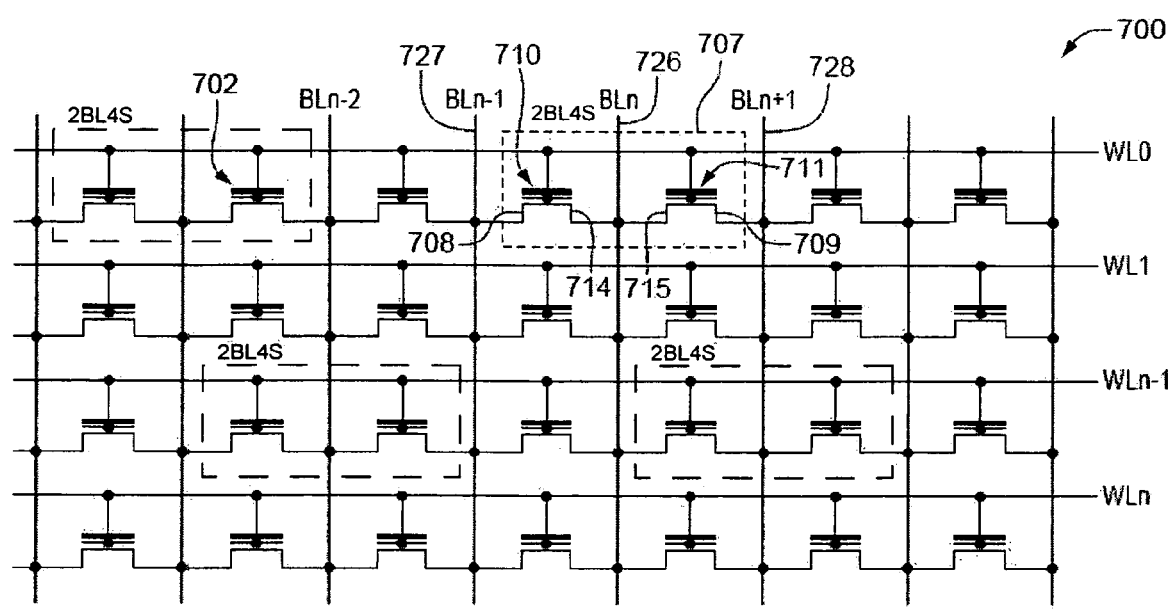
FIG. 14 is a circuit diagram illustrating a 2BL2S dual bit lines dual storage elements architecture virtual ground NOR flash memory with dual floating gates core architecture.

FIG. 14 shows an architecture of a NOR array, i.e., a virtual ground NOR flash memory core array 700 with dual floating gate transistors, such as 702, 710, and 711. In this architecture, there are four transistors, 708, 709, 714, and 715 in a 2BL4S cell 707. Each of the vertical bit lines can be used as either a data bit line or virtual ground line depending on which side of the dual floating gate is being accessed. For example, if 726 is a virtual ground line, 728 and 727 are bit lines based on the cell pair 708-709 or 714-715 depending on the voltages applied on 726, 727, and 728. So, there are only two floating gate storage elements that would be selected each time on one of the corresponding 2BL4S cells. Each of the 2BL4S cells has four floating gate storage elements. It is depending on the select circuitry to decide the pairing of the four floating gate storage elements.

There have been described novel electronic memory architectures utilizing the un-used states of a true and complementary dual bit lines dual storage elements memory cell. Now that the various memory architectures using the cell have been described, those skilled in the electronics arts may make many variations. It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiments described, without departing from the inventive concepts. It is also evident that the methods recited may, in many instances, be performed in a different order, or equivalent components may be used in the memories, and/or equivalent processes maybe substituted for the various processes described. Consequently, the invention is to be construed as embracing each and every novel feature and novel combination of features present in and/or possessed by the invention herein described.

What is claimed as new and desired to be protected by Letters Patent of the United States is:

1. An electronic memory comprising:
    four bit lines and four binary storage elements, each of said binary storage elements connected or connectable to one of said bit lines;
    a write circuit for writing bits of data to said four binary storage elements wherein at least one of said data bits is used to determine the binary electronic memory states of all four binary storage elements; and
    a read circuit for reading data bits from said storage elements, wherein at least one data bit is determined by the binary electronic memory states of all four binary storage elements.

2. The electronic memory as in claim 1 wherein said write circuit further writes an option flag bit to said four binary storage elements and said read circuit further reads an option flag bit from said binary storage elements.

3. The electronic memory as in claim 1 wherein said read and write circuits include a bit width select circuit for selecting whether two or three bits of data are read from and written to said four binary storage elements.

4. The electronic memory as in claim 3 wherein said bit width select circuit includes circuit elements for selecting whether two, three, or four bits of data are read from and written to said four binary storage elements.

5. The electronic memory as in claim 1 wherein said read and write circuits include a bit width select circuit for selecting whether three or four bits of data are read from and written to said four binary storage elements.

6. The electronic memory as in claim 1 wherein said memory has a data bus width not divisible by three where a combination of bit width two and three are used.

7. The electronic memory as in claim 1 wherein said memory is a flash memory.

8. The electronic memory as in claim 7 wherein said memory is a NAND memory.

9. The electronic memory as in claim 7 wherein said memory is a NOR memory.

10. The electronic memory as in claim 7 wherein said memory is a virtual ground memory.

11. The electronic memory as in claim 1 wherein said memory is a read only memory (ROM).

12. The electronic memory as in claim 1 wherein said memory is a dynamic memory.

13. The electronic memory as in claim 1 wherein said memory is a dynamic random access memory (DRAM) or a dynamic register.

14. The electronic memory as in claim 1 wherein said memory cells include a MOS capacitor.

15. The electronic memory as in claim 1 wherein said memory is an ovonic unified memory (OUM).

16. The electronic memory as in claim 1 wherein said memory is a magnetoresistive random access memory (MRAM).

17. The electronic memory as in claim 1 wherein said memory is a ferroelectric memory.

18. The electronic memory as in claim 17 wherein said memory is a destructive read out memory.

19. The electronic memory as in claim 17 wherein said memory is a non-destructive readout memory.

20. A method of operating an electronic memory, said method comprising:
    providing a memory having four bit lines and four binary storage elements, each of said binary storage elements connected or connectable to one of said bit lines;
    writing three bits of data to said four binary storage elements in a manner such that at least one of said data bits is used to determine the binary electronic memory states of all four binary storage elements; and
    reading three data bits from said storage elements in a manner such at least one data bit is determined by the binary electronic memory states of all four binary storage elements.

* * * * *